United States Patent [19]

Kalishman

[11] Patent Number: 5,057,770

[45] Date of Patent: Oct. 15, 1991

[54] ELECTRICAL PROBE

[76] Inventor: Calvin Kalishman, 7034 Arbor View La., Newport Richey, Fla. 34653

[21] Appl. No.: 440,989

[22] Filed: Nov. 22, 1989

[51] Int. Cl.⁵ .............................................. G01R 1/06
[52] U.S. Cl. .................................. 324/149; 324/72.5; 324/556
[58] Field of Search ...................... 324/149, 133, 72.5, 324/555, 556

[56]  References Cited

U.S. PATENT DOCUMENTS

| | | | |
|---|---|---|---|
| 3,522,533 | 8/1970 | Bergero | 324/149 |
| 3,612,999 | 10/1971 | Bergero | 324/149 |
| 3,829,776 | 8/1974 | Lozoya | 324/149 X |
| 4,114,095 | 9/1978 | Pankove et al. | 324/149 X |
| 4,634,971 | 1/1987 | Johnson et al. | 324/149 X |
| 4,893,086 | 1/1990 | Shrewsbury | 324/149 X |

Primary Examiner—Kenneth A. Wieder
Assistant Examiner—Robert W. Nueller
Attorney, Agent, or Firm—Wolf, Greenfield & Sacks

[57] ABSTRACT

A hand-held probing device is adapted for use in testing the existence and amount of electrical potential in an automobile engine block or other object under investigation. The device has a specially formed housing from which extends a probe and a ground lead at opposite ends. The housing also includes a voltmeter and an electric bulb connected in parallel between the probe and ground lead. The housing also includes a switch which enables the device to be operated while held in one hand thus enabling the other of the user's hand to be free and usable for other functions.

1 Claim, 1 Drawing Sheet

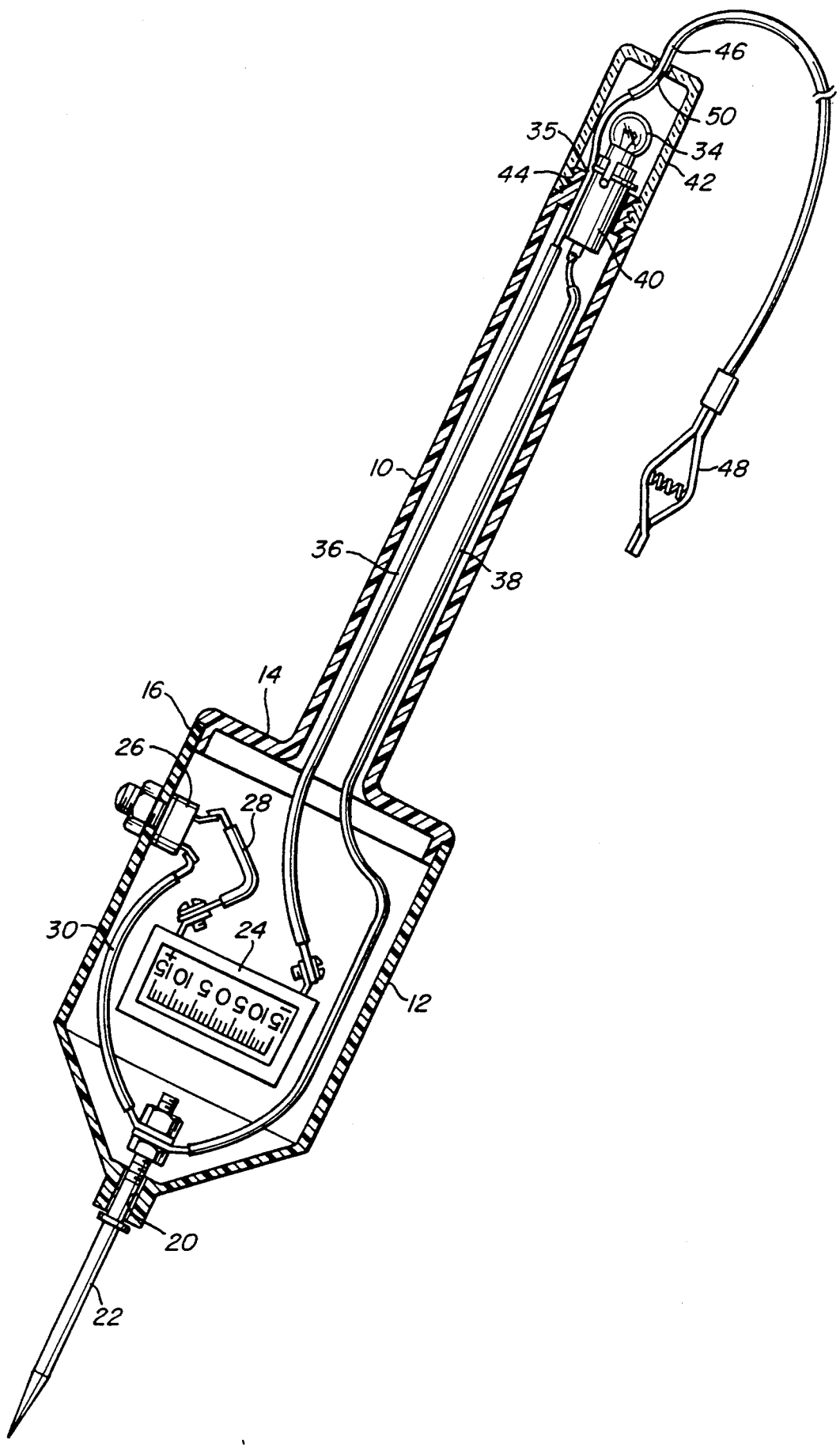

5,057,770

ELECTRICAL PROBE

BACKGROUND OF THE INVENTION

The present invention relates to electrical testing probes and pertains, more particularly, to an improved probe which enables the user to detect easily the existence of any electrical potential, particularly for automotive applications in testing electrical components of an automobile.

SUMMARY OF THE INVENTION

Although the invention is intended for use primarily to determine the existence of an electrical potential in an automotive application, it may be used similarly to test the existence of a voltage or potential in other applications. The probe includes a non-metallic housing, preferably plastic, which is adapted to be held easily in and operated by one hand. Unlike other probes employed for this purpose, particularly in automotive maintenance, all of the necessary elements are contained within the hand-held probing device itself. There is no need to connect leads from the probe to external measuring or detecting equipment. The user can determine the existence and amount of electrical potential without referring to the remote instruments.

The device includes an elongated probe at one end and a ground clip at the other end. The device has an enlarged housing at its forward probe end which contains a voltmeter and a normally open switch connected in series. Extending rearwardly from the enlarged housing is a narrowed handle having a lamp at the rear end, the lamp being exposed through a clear plastic cover at the end of the handle. The lamp is connected in parallel with the switch and volt meter by means of wires passing through the housing and the handle. When using the device to test the potential in an automobile engine, the ground clip may be attached to the chassis of the vehicle and the probe is contacted with the engine block or other elements under investigation. The switch then is closed. If any electrical potential exists between the two points being tested, namely the probe and the ground clip, then the electric lamp will light and the voltmeter will read the voltage level. The device is operated with one hand which frees the user's other hand for other functions.

It is among the primary objects of the invention to provide a simple probe to enable one to detect the existence of an electrical potential in a member such as an automobile engine block.

Another object of the invention is to provide a probe which may be gripped and operated easily by one hand and which contains both an indicator light and a voltmeter which enables the voltage to be detected without reference to any external measuring or testing devices.

DESCRIPTION OF THE DRAWINGS

These and other objects and advantages of the invention will be understood more fully from the following detailed description thereof with reference to the accompanying drawing which shows the device in longitudinal section.

DESCRIPTION OF THE PREFERRED EMBODIMENT

As shown in the drawing, the device is of elongated configuration having a slim easily gripped handle 10 at its rear and an enlarged cylindrical housing 12 at its forward end. The handle 10 and housing 12 are formed from an insulative material such as an appropriate plastic. In the preferred construction, the forward end of the handle 10 includes an enlarged flange 14 having a rim 16 formed forwardly about is periphery. The rim 16 preferably engages the rear end of the housing 12 in a snap-fit to enable these parts to be detachably secured to each other. The forward end of the housing 12 has an opening 20 formed therein through which a conductive probe 22 extends forwardly. The rear end of the probe 22 is disposed within the housing and is connected to a voltmeter 24 through a switch 26 by the wires 28, 30 respectively. Switch 26 is secured to the housing 12 and is exposed through the housing so that it may be operated conveniently by the user's finger or thumb. The switch 26 is of normally open configuration and requires actuation when the probe is being used. The voltmeter 24 is securely mounted within the housing. The housing 12 includes a clear plastic window to expose the voltmeter scale and enable it to be read easily. The voltmeter is connected in parallel with a conventional resistance lamp 34 located at the rearward end of the handle 10 by means of wires 36, 38. The rear end of the handle 10 includes a bayonet type socket 40 to which the wires 36, 38 are connected. The socket may be press-fitted into the handle and receives the lamp 34. This entire assembly is enclosed in a clear plastic cover 42 which may be threaded on to a reduced portion 44 at the end of the handle. A ground lead 46 is connected to one of the socket terminals and has a clip 48 at its outer end. The ground lead 46 passes through a hole 50 formed in the end of the cover 42.

The device is very simple to use in that the ground clip need only be attached to a suitable ground or reference voltage member such as an automobile chassis. With the device held in one hand, the probe is brought firmly into contact with the electrical component being tested which may be an engine block the switch is depressed by the user's finger or thumb. The existence of a potential will be indicated immediately by lighting of the lamp 34. The user may determine the magnitude of the potential simply by reading the exposed voltmeter scale on the side of the housing 12. There is no need to refer to or manipulate any external electrical apparatus and the test may be completed simply and rapidly. Because the complete device is self-contained and is easily operable it may be used to test the existence and magnitude of electric potentials in a variety of adjacent locations.

It is furthermore noted, with regard to the socket 40, that the wire 36, 46, although covered along a substantial portion of its length has the actual metal wire 35 exposed along a segment thereof. This is then in contact with the socket 40 to complete the circuit. The other wire 38 has its conductor connected to the center electrode of the socket associated with the center electrode of the lamp 34.

In the drawing, the voltmeter 24 is illustrated having a scale primarily adapted for automotive applications. However, this scale may also be in different voltage ranges such as one in a range of 0 to 150 volts. This could be used for household applications. Also, the lamp 34 may be replaced by some type of a neon illuminating means.

It should be understood that the foregoing description of the invention is intended merely to be illustrative thereof and that other embodiments and modifications may be apparent to those skilled in the art without departing from its spirit.

What is claimed is:

1. An elongated electrical probe comprising:

an elongated hollow handle;

a hollow housing secured to the forward end of said handle;

an electrically conductive housing secured to and extending forwardly from said housing, the rear end of said probe being disposed within said housing;

said handle and said housing having cylindrical cross-sectional configurations, said housing, handle and probe being arranged on a common longitudinal axis, said housing being of a larger cross-sectional diameter than that of said handle;

a voltmeter mounted within said housing and having a scale thereof, said housing including a window to enable said scale to be read through;

a lamp means mounted to the rear of said handle;

said lamp means includes a lamp;

said lamp means including a socket secured to the rear end of said handle and opening rearwardly therefrom;

wire means connecting said rear end of said probe to said voltmeter and said lamp means, said voltmeter and said lamp means being connected in parallel;

said probe has a first concentric fastener disposed on the forward side thereof, said first concentric fastener contacting said housing for securing said probe to said housing;

said probe having a set of concentric fasteners axially spaced apart on the rear side thereof, said wire means sandwiched therebetween for physically securing and electrically connecting said probe to said wire means;

said wire means including an isolated wire having a segment thereof that is exposed for contact with the lamp socket;

a ground lead wire connected to said lamp, the free end of said ground wire including a ground clip attached thereto;

a normally open switch secured to a side wall of said housing at a relatively close position to said handle and being operable for outside of said housing, said switch being connected in series between said rear end of said probe and said voltmeter for enabling closing of the circuit between said probe and said voltmeter for enabling detection of a voltage;

means securing said normally open switch to said housing at a position within finger distance of the end of said handle that attaches to said housing;

a transparent plastic cap connectable to the rear end of said handle and defining a lamp chamber to protect said lamp and enable operation of said lamp to be viewed, said cap having a hole therein to enable said ground wire to pass rearward therethrough;

two inwardly directed flanges defining shoulders located within said hollow handle in the rear side thereof, said shoulders for receiving said socket and supporting said plastic cap; and said handle being at least as long as the combined length of said housing and said electrically conductive probe.

* * * * *